United States Patent
Swanson et al.

(10) Patent No.: US 10,570,011 B1
(45) Date of Patent: Feb. 25, 2020

(54) METHOD AND SYSTEM FOR FABRICATING A MICROELECTROMECHANICAL SYSTEM DEVICE WITH A MOVABLE PORTION USING ANODIC ETCHING OF A SACRIFICIAL LAYER

(71) Applicant: The United States of America as represented by the Secretary of the Navy, San Diego, CA (US)

(72) Inventors: Paul D. Swanson, Santee, CA (US); Andrew Wang, San Diego, CA (US)

(73) Assignee: United States of America as represented by Secretary of the Navy, Washington, DC (US)

( * ) Notice: Subject to any disclaimer, the term of this patent is extended or adjusted under 35 U.S.C. 154(b) by 0 days.

(21) Appl. No.: 16/117,456

(22) Filed: Aug. 30, 2018

(51) Int. Cl.
*B81C 1/00* (2006.01)
*H01L 29/84* (2006.01)
*B81C 99/00* (2010.01)
*C25F 3/08* (2006.01)

(52) U.S. Cl.
CPC ...... *B81C 1/00476* (2013.01); *B81C 99/0025* (2013.01); *C25F 3/08* (2013.01); *B81C 2201/0107* (2013.01); *B81C 2201/0139* (2013.01)

(58) Field of Classification Search
CPC .............. B91C 1/00476; H01L 2924/0002
USPC .......................................................... 438/50
See application file for complete search history.

(56) References Cited

U.S. PATENT DOCUMENTS

| | | | |
|---|---|---|---|
| 6,369,931 B1* | 4/2002 | Funk | B81B 3/004 216/2 |
| 6,753,488 B2* | 6/2004 | Ono | H01H 1/027 200/181 |
| 8,357,616 B2 | 1/2013 | Linder et al. | |

(Continued)

OTHER PUBLICATIONS

Vincent Linder et al., Water-Soluble Sacrificial Layers for Surface Micromachining, Small, 2005, 730-36, vol. 1 No. 7, Wiley-VCH Verlag GmbH & Co. KGaA, Weinheim, Germany.

(Continued)

*Primary Examiner* — Jami Valentine Miller
(74) *Attorney, Agent, or Firm* — Naval Information Warfare Center, Pacific; Kyle Eppele; Young Fei

(57) ABSTRACT

A method for fabricating a microelectromechanical system device. Submerging a microelectromechanical system device in water. The microelectromechanical system devices include a sacrificial layer deposited on the surface of a substrate between the portion of a structural layer to be freed for movement and a base. Anodically etching the sacrificial layer from the microelectromechanical device to free the portion of the structural layer for movement. A system comprising a solution of water, a microelectromechanical system device including a sacrificial layer of chromium deposited on the surface of a substrate between a portion of a structural layer and a base. The microelectromechanical system device is submerged in the solution of water. An electrode is submerged in the water. The electrode provides a negative bias. A voltage source provides a positive bias to the sacrificial layer of chromium, anodically etching the sacrificial layer of chromium and freeing the portion of the structural layer.

20 Claims, 3 Drawing Sheets

(56) References Cited

U.S. PATENT DOCUMENTS

| | | | | |
|---|---|---|---|---|
| 8,575,005 B2* | 11/2013 | Accardi | ............. | H01L 21/6835 257/E21.088 |
| 2003/0217915 A1* | 11/2003 | Ouellet | ................ | B22F 1/0051 204/192.15 |
| 2009/0014296 A1* | 1/2009 | Weber | ................. | H01H 1/0036 200/181 |
| 2009/0270300 A1 | 10/2009 | Uehara et al. | | |

OTHER PUBLICATIONS

National Programme on Technology Enhanced Learning (NPTEL), Surface Micromachining of Microstructures, Micro and Smart Systems (Online Lecture).

* cited by examiner

METHOD AND SYSTEM FOR FABRICATING A MICROELECTROMECHANICAL SYSTEM DEVICE WITH A MOVABLE PORTION USING ANODIC ETCHING OF A SACRIFICIAL LAYER

FEDERALLY SPONSORED RESEARCH AND DEVELOPMENT

The Method and System for Fabricating a Microelectromechanical System Device with a Movable Portion Using Anodic Etching of a Sacrificial Layer is assigned to the United States Government and is available for licensing and commercial purposes. Licensing and technical inquiries may be directed to the Office of Research and Technical Applications, Space and Naval Warfare Systems Center Pacific (Code 72120), 53560 Hull Street, San Diego, Calif., 92152, via telephone at (619) 553-5118, or email at ssc_pac_t2@navy.mil. Reference Navy Case 103560 in all communications.

BACKGROUND OF THE INVENTION

1. Field of the Invention

The present invention relates generally to the fabrication of a microelectromechanical system. More particularly, the present invention relates to the fabrication of a microelectromechanical system with a movable portion using the anodic etching of a sacrificial layer.

2. Background

Microelectromechanical systems (MEMS) devices are tiny components produced through a microfabrication process. The microfabrication process generally involves deposition of multiple layer, including a structural layer and a sacrificial layer, onto a substrate and the removal of the sacrificial layer using etching, leaving desired structural components on the substrate.

MEMS devices that include moving portions are generally fabricated using additive deposition techniques and subtractive etching techniques to fabricate one or more structural layers, including fixed portions and portions that are to be moved, separated by a sacrificial material. When the sacrificial material is removed, the movable portions are freed from the fixed portions.

It is important for the structural layers not to be damaged by the process used to remove the sacrificial layer. Conventionally, materials such as silicon dioxide ($SiO_2$) are deposited as the sacrificial material on a silicon substrate along with a layer of structural material include, for example, patterns of metallization. A solution such as hydrogen fluoride (HF) is used to etch away the $SiO_2$ to free the movable portions of the layer of structural material from the fixed portions. While HF is effective at etching away a sacrificial material such as $SiO_2$, HF may damage other portions of the MEMS device. The poor selectivity of this type of etching limits its usefulness when applied to a wide range of relatively fragile microelectronic materials. Furthermore, the toxicity of HF makes it inconvenient and/or hazardous for inexperienced users, and it poses difficult disposal requirements. Thus, selective etching may not always be feasible using $SiO_2$ as the sacrificial layer.

SUMMARY OF THE INVENTION

A method for fabricating a microelectromechanical system device, comprising the steps of submerging a microelectromechanical system device in water, wherein the microelectromechanical system devices includes a sacrificial layer deposited on the surface of a substrate between the portion of a structural layer to be freed for movement and a base, and the step of anodically etching the sacrificial layer from the microelectromechanical device to free the portion of the structural layer for movement.

A system comprising a solution of water, a microelectromechanical system device including a sacrificial layer of chromium deposited on the surface of a substrate between a portion of a structural layer and a base. The microelectromechanical system device is submerged in the solution of water. An electrode is submerged in the water, and the electrode provides a negative bias. A voltage source provides a positive bias to the sacrificial layer of chromium in order to anodically etch the sacrificial layer of chromium and free the portion of the structural layer of the microelectromechanical system device for movement.

BRIEF DESCRIPTION OF THE DRAWINGS

Throughout the several views, like elements are referenced using like elements. The elements in the figures are not drawn to scale, and some dimensions may be exaggerated for clarity.

DETAILED DESCRIPTION OF THE INVENTION

According to an illustrative embodiment, a microelectromechanical system (MEMS) device including movable portions is formed by anodic etching of a sacrificial layer of chrome in a benign solution. The sacrificial layer of chrome separates portions of the MEMS device to be freed for movement from portions of the MEMS device that remain fixed. Using anodic etching, the sacrificial layer of chrome can be removed from thin gaps to free portions of the MEMS device for movement without damaging other portions of the MEMS device.

Figure 1:
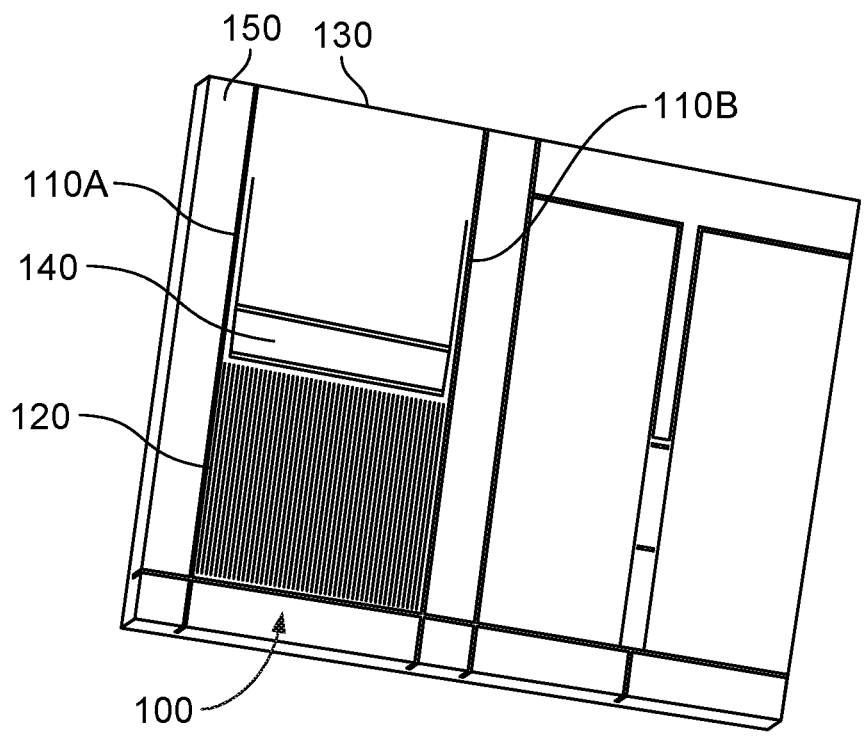
FIG. 1 is a top perspective view of an integrated chip including a MEMS device with portions to be freed for movement according to an illustrative embodiment.

FIG. 1 illustrates a top view of an integrated chip including a MEMS device 100 with portions to be freed for movement according to an illustrative embodiment. As shown in FIG. 1, the MEMS device 100 includes a structural layer including portions 110A, 110B, and 120 to be freed for movement.

The MEMS device 100 also includes another portion 130 that is to remain fixed. In one example, the portion 130 may be included in the same structural layer or in a different structural layer than the portions 110A, 110B, and 120.

The MEMS device 100 also includes a frame 150 to which the portions 110A, 110B, 120, and 130 are attached. The frame 150 and the portions 110A, 110B, 120, and 130 are originally secured to an underlying base. A sacrificial layer that is not visible in FIG. 1 is deposited between portions 120, 110A, and 110B to be freed from the base.

The portions 110A, 110B, and 120 are freed from the frame 150 and the base by anodic etching of the sacrificial layer, as described in more detail below. The top portion 130 will remain attached to the base. Once released from the frame 150, the portions 110A and 110B will act as cantilevers anchored to the top portion 130, allowing the portion 120 to move back and forth.

Figure 2:
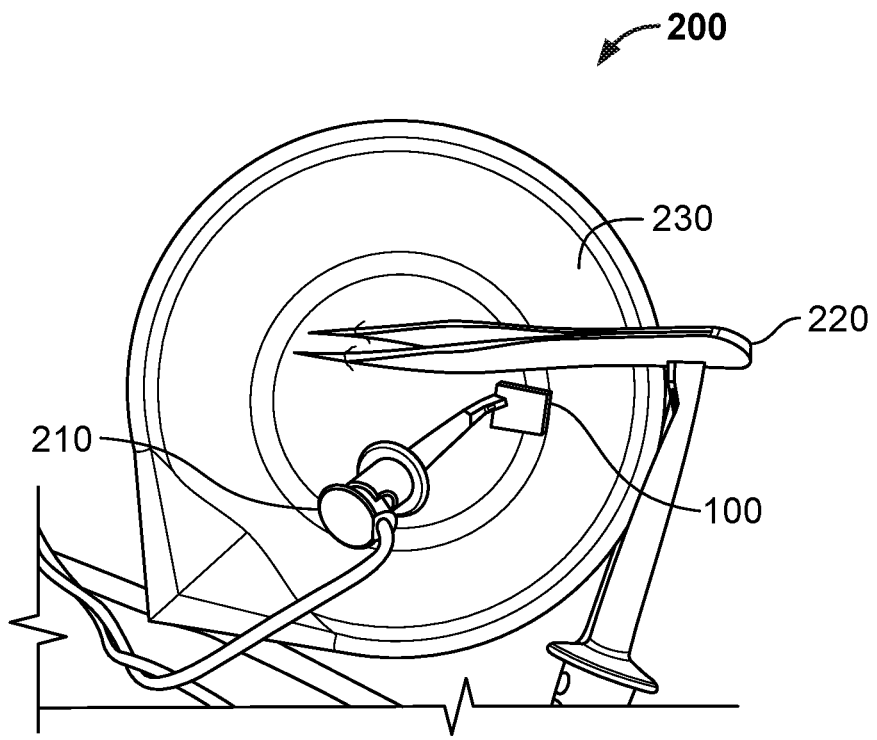
FIG. 2 is a top perspective view of a system for fabricating a MEMS device with a moveable portion according to an illustrative embodiment.

FIG. 2 illustrates a system for fabricating a MEMS device with a movable portion according to an illustrative embodiment. The system 200 includes an integrated chip with a MEMS device 100 submerged in a beaker filled with a benign solution 230. The solution 230 may include deionized water. Alternatively, the solution 230 may include non-deionized water, or the water may include dilute acids or bases to reduce the electrical resistance of the water.

The system 200 also includes an electrode 220 submerged in the solution 230. The electrode 220 provides a negative bias. In the system shown in FIG. 2, the electrode 220 is a stainless steel pair of tweezers. It should be appreciated that this is shown by way of example and that any suitable electrode may be used to provide the negative bias.

The system 200 also includes a wire 210 that is in electrical contact via a contact pad 140 with a sacrificial layer that is deposited between the portions of a structural layer to be freed (e.g., the portions 110A, 110B, and 120) and a base. While the sacrificial layer is described herein as including chromes, the sacrificial layer may include any material that can be anodically etched.

The wire 210 may be made of platinum or any other suitable metal. The wire 210 provides a conductive path between the sacrificial chromium layer and a voltage source, thereby providing a positive bias. The voltage source (not shown) may include, for example, a voltage source set at approximately 30 volts for applying a bias voltage to the sacrificial chromium layer in a solution of deionized water. It should be noted that lower bias voltages may be used for more conductive solutions.

When the voltage is applied to the contact pad 140 via the wire 210, current will flow vertically through the portions to be freed (e.g., the portions 110A, 110B, and 120), anodically etching the sacrificial layer of chrome and releasing the portions 110A, 110B, and 120 from the frame 150 and the base. If the top layer of the base is non-conducting, then a layer of sacrificial chrome could exist between the frame and the base. In this case, the portion of the sacrificial layer of chrome underlying the frame 150 would not be anodically etched as there would be no current flowing through it.

Wherever the sacrificial layer of chrome comes into contact with the solution 230, the chrome dissolves in the solution. As this etching process is not product or reactant driven, it is not inhibited in narrow gaps.

After the chrome is etched, the water is removed from the MEMS device 100 using, for example, critical point drying. This prevents van der Waals forces from binding the moving portions 110A, 110B, and 120 to the surface of the fixed portion 130.

Figure 3A:
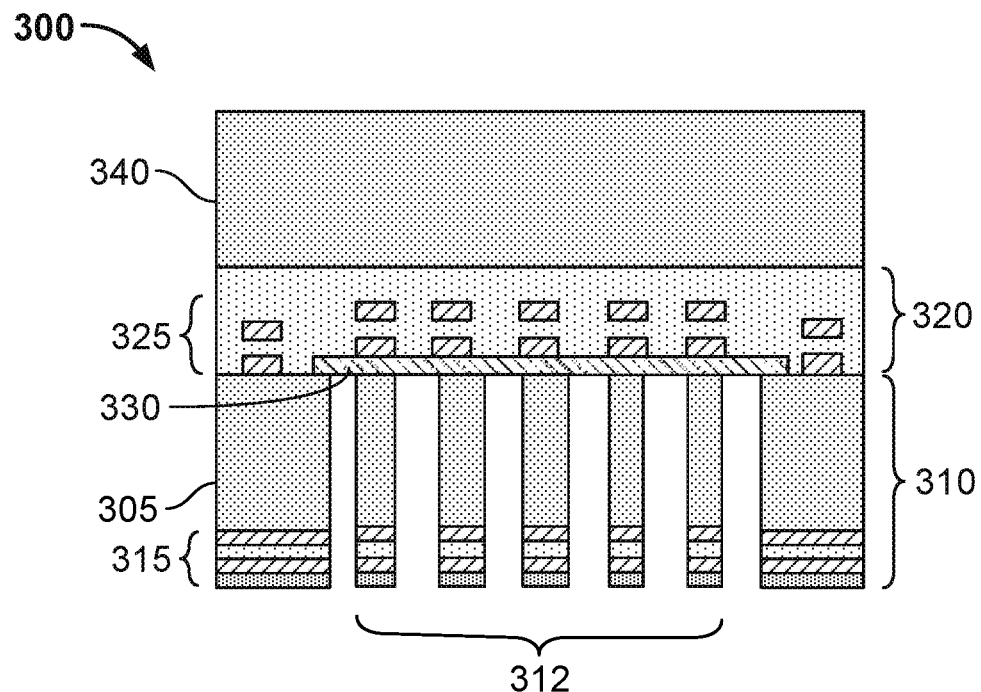
FIG. 3A is a cross-sectional view of a stage in the process of anodically etching a sacrificial layer to free a portion of a MEMS device for movement according to an illustrative embodiment.
Figure 3B:
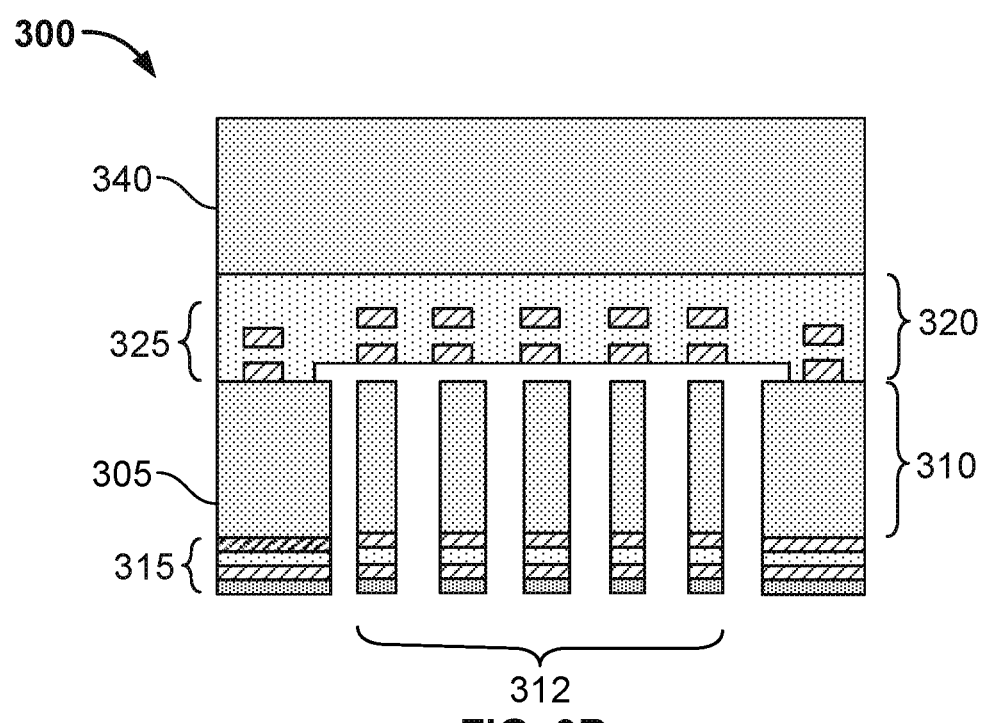
FIG. 3B is a cross-sectional view of a stage in the process of anodically etching a sacrificial layer to free a portion of a MEMS device for movement according to illustrative embodiments.

FIGS. 3A and 3B illustrate cross-sectional views of stages in a process for anodically etching a sacrificial layer to free a portion of a MEMS device for movement according to illustrative embodiments. It should be appreciated that configuration of layers shown in these stages are given by way of example only, and that other configurations may be used.

In a first stage depicted in FIG. 3A, a MEMS device 300 includes a structural layer 310 including portions to be freed for movement and a structural layer 320 including portions to remain fixed. In this example, the structural layers 310 and 320 are separated by a sacrificial layer of chrome 330.

The structural layer 310 includes patterns of metallization 315 formed via deposition on a surface of a silicon substrate 305 with deep etching. The structural layer 320 includes patterns of metallization 325 formed via deposition over the surface of the substrate 305 that is opposite the surface on which patterns of metallization 315 are deposited. A sacrificial layer of chrome 330 is deposited on an opposite surface of the substrate 305, between the structural layer 310 and the structural layer 320.

Portions of the structural layer 310 to be freed are designated by reference numeral 312. The other portions of the structural layer 310 that are not designated by the reference numeral 312 act as part of a "frame" as described with reference to FIG. 1. The structural layer 320 also acts as part of the "frame" described above with reference to FIG. 1.

Another silicon substrate 340 may be adhered to the structural layer 320, acting as a "base" described above with reference to FIG. 1.

In a second stage shown in FIG. 3B, the sacrificial layer of chrome 330 is selectively removed by anodic etching, freeing the portions 312 of the structural layer 310 for movement. As the anodic etching is performed in a benign solution, the structural layers 310 and 310, and their respective matters of metallization 315 and 325 are not damaged.

It should be appreciated that the stages shown in FIGS. 3A and 3B are provided by way of example only and that a sacrificial layer of chrome may be used with other configurations of materials to free portions of a MEMS device for movement. For example, instead of depositing the sacrificial layer of chrome on a surface of silicon substrate that is deep etched, the sacrificial layer of chrome may be deposited on the surface of a thin film of suitable material.

Figure 4:
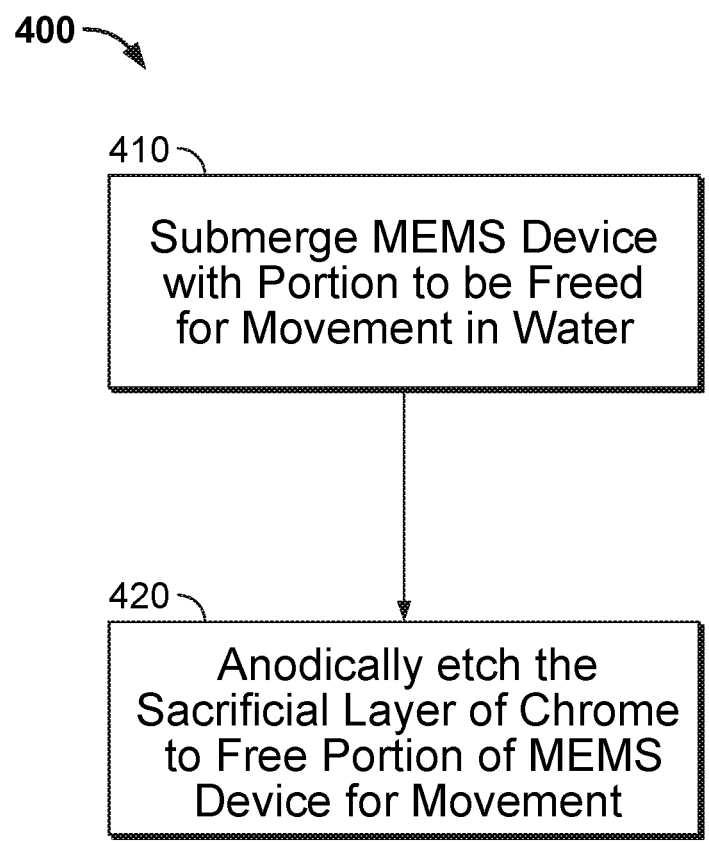
FIG. 4 is a flowchart showing steps in a process for anodically etching a sacrificial layer to free a portion of a MEMS device for movement according to illustrative embodiments.

FIG. 4 is a flowchart showing steps in a process for fabricating a MEMS device according to an illustrative embodiment. It should be appreciated that fewer, additional, or alternative steps may be involved in the process and/or some steps may occur in a different order.

Referring to FIG. 4, the process 400 begins at step 410, at which a MEMS device, such as the MEMS device 100 on the integrated chip shown in FIG. 1 is submerged in a benign solution. As explained above, the MEMS device includes a sacrificial layer of chrome deposited between a structural layer of the MEMS device that is to be freed for movement and a base.

At step 420, the sacrificial layer of chrome is anodically etched from the MEMS device to free the portion of the structural layer for movement. This step may include submerging an electrode in water and applying a positive voltage bias to the sacrificial layer of chrome as described above.

Although not shown, it should be appreciated that after the sacrificial layer of chrome is etched, the MEMS device may be removed from the water. Any remaining water may be removed from the MEMS device using techniques such as critical point drying in order to prevent van der Waals forces from binding the moving portions of the MEMS device to the surfaces of the fixed portions.

From the above description of the present invention, it is manifest that various techniques may be used for implementing its concepts without departing from the scope of the claims. The described embodiments are to be considered in all respects as illustrative and not restrictive. The method and system disclosed herein may be practiced in the absence of any element that is not specifically claimed and/or disclosed herein. It should also be understood that the present invention is not limited to the particular embodiments described herein, but is capable of being practiced in many embodiments without departure from the scope of the claims.

What is claimed is:

1. A method for fabricating a microelectromechanical system device comprising:
   submerging a microelectromechanical system device in water, wherein the microelectromechanical system device includes a sacrificial layer deposited between a portion of a structural layer that is to be freed for movement and a base; and
   anodically etching the sacrificial layer from the microelectromechanical system device to free the portion of the structural layer for movement.

2. The method of claim 1, wherein the step of anodically etching comprises:
   submerging an electrode in the water to provide a negative bias; and
   applying a positive bias voltage to the sacrificial layer, causing the sacrificial layer to dissolve in the water.

3. The method of claim 2, wherein the sacrificial layer is chromium.

4. The method of claim 2, wherein the water is deionized.

5. The method of claim 2, wherein the structural layer includes a pattern of metallization.

6. The method of claim 5, wherein the microelectromechanical system device includes another structural layer.

7. The method of claim 6, wherein the another structural layer includes another pattern of metallization.

8. The method of claim 7, wherein the anodic etching of the sacrificial layer does not damage either pattern of metallization.

9. The method of claim 7, wherein the bias voltage is 30 volts.

10. A method for fabricating a microelectromechanical system device comprising:
    submerging a microelectromechanical system device in deionized water, wherein the microelectromechanical system device includes a chromium layer deposited on a surface of a substrate, between a portion of a structural layer that is to be freed for movement and a base;
    submerging an electrode in the deionized water to provide a negative bias;
    applying a positive bias voltage to the chromium layer, causing the chromium layer to dissolve in the deionized water; and
    wherein the bias voltage is 30 volts.

11. A system comprising:
    a solution of water;
    a microelectromechanical system device including a sacrificial layer of chromium deposited between a portion of a structural layer and a base, wherein the microelectromechanical system device is submerged in the solution of water;
    an electrode submerged in the water, wherein the electrode provides a negative bias; and
    a voltage source providing a positive bias to the sacrificial layer of chromium to anodically etch the sacrificial layer of chromium and free the portion of the structural layer of the microelectromechanical system device for movement.

12. The system of claim 11, wherein the water is deionized.

13. The system of claim 11, wherein the structural layer includes a pattern of metallization.

14. The system of claim 13, wherein the microelectromechanical system device includes another structural layer.

15. The system of claim 14, wherein the other structural layer includes another pattern of metallization.

16. The system of claim 15, wherein anodic etching of the sacrificial layer of chromium does not damage either pattern of metallization.

17. The method of claim 1, wherein the sacrificial layer is deposited on a surface of a substrate.

18. The method of claim 1, wherein the water is a dilute solution for reducing electrical resistance of the water.

19. The system of claim 11, wherein the sacrificial layer is deposited on a surface of a substrate.

20. The system of claim 11, wherein the water is a dilute solution for reducing electrical resistance of the water.

* * * * *